US006930835B2

(12) United States Patent
Mearini et al.

(10) Patent No.: US 6,930,835 B2
(45) Date of Patent: Aug. 16, 2005

(54) ATOMIC LAYER CONTROLLED OPTICAL FILTER DESIGN FOR NEXT GENERATION DENSE WAVELENGTH DIVISION MULTIPLEXER

(75) Inventors: Gerald T. Mearini, Shaker Heights, OH (US); Laszlo Takacs, Shaker Heights, OH (US)

(73) Assignee: Atomic Telecom, Cleveland, OH (US)

( * ) Notice: Subject to any disclaimer, the term of this patent is extended or adjusted under 35 U.S.C. 154(b) by 90 days.

(21) Appl. No.: 09/865,153

(22) Filed: May 24, 2001

(65) Prior Publication Data

US 2002/0003665 A1 Jan. 10, 2002

Related U.S. Application Data

(60) Provisional application No. 60/207,101, filed on May 25, 2000, provisional application No. 60/206,934, filed on May 25, 2000, and provisional application No. 60/207,100, filed on May 25, 2000.

(51) Int. Cl.[7] .................................................. G02B 1/10
(52) U.S. Cl. ...................... 359/582; 359/580; 359/577
(58) Field of Search ................................. 359/580, 582, 359/577, 581, 586–588

(56) References Cited

U.S. PATENT DOCUMENTS

| 4,747,922 A | 5/1988 | Sharp ..................... 204/192.11 |
| 4,987,007 A | * | 1/1991 | Wagal et al. ............... 427/526 |

(Continued)

OTHER PUBLICATIONS

Kumar, et al.; *Near-Infrared Bandpass Filter from Si/SiO₂*; Multilayer Coatings; Feb. 1999.
Suntola, T.; *Cost-Effective Processing by Atomic Layer Epitaxy;*.1993.

(Continued)

*Primary Examiner*—Drew A. Dunn
*Assistant Examiner*—Joshua L Pritchett
(74) *Attorney, Agent, or Firm*—Duane Morris LLP

(57) ABSTRACT

An optical filter using alternating layers of materials with "low" and "high" indices of refraction and deposited with atomic layer control has been developed. The multilayered thin film filter uses, but is not limited to, alternating amorphous layers of atomically controlled Si (n=3.56) as the high index material and diamond-like carbon (DLC, n=2.0) as the low index material. The Si layers are grown with a self-limiting pulsed molecular beam deposition process which results in layer-by-layer growth and thickness control to within one atomic layer. The DLC layers are produced using an ion-based process and made atomically smooth using a modified Chemical Reactive-Ion Surface Planarization (CRISP) process. Intrinsic stress is monitored using an in-situ cantilever-based intrinsic stress optical monitor and adjusted during filter fabrication by deposition parameter modification. The resulting filter has sufficient individual layer thickness control and surface roughness to enable ~12.5 GHz filters for next generation multiplexers and demultiplexers with more than 1000 channels in the wavelength range 1.31–1.62 $\mu$m.

9 Claims, 1 Drawing Sheet

SURFACE PLANARIZATION (Modified CRISP) PROCESS

A) Atomic Layer Deposited Amorphous Si thin film $R_a = 0.2$ nm
Si Thin film
Substrate B) Amorphous Diamond-Like Carbon Deposition C) Chemical etching of carbon by highly focused oxygen ion beam at near grazing incidence Ion source D) Planarized surface with significantly reduced surface roughness $R_a = 0.05$ nm

U.S. PATENT DOCUMENTS

| | | | |
|---|---|---|---|
| 5,377,045 A | * 12/1994 | Wolfe et al. | 359/585 |
| 5,529,671 A | 6/1996 | Debley et al. | 204/192.34 |
| 5,725,413 A | 3/1998 | Malshe et al. | 451/41 |
| 5,748,350 A | 5/1998 | Pan et al. | 359/130 |
| 6,205,270 B1 | 3/2001 | Cao | 385/24 |
| 6,233,261 B1 | 5/2001 | Mesh et al. | 372/32 |
| 6,545,809 B1 * | 4/2003 | Phillips | 359/577 |

OTHER PUBLICATIONS

Bachman, et al.; *Molecular Layer Epitaxy by Real–Time Optical Process Monitoring*; Department of Materials Science and Engineering, North Carolina State University, 1997.

H., Kawai, T. Tabata; *Atomic Layer Control of the Growth of Oxide Superconductors Using Laser Molecular Beam Epitaxy*; 1997.

Spiller, E;*Smoothing of Multilayer X–Ray Mirrors by Ion Polishing*; IBM Research Division, Thomas J. Watson; 1993.

Puik, E.J, van der Wiel and Zeijlemaker, H, and Verhoeven, J.; *Ion Etching of Thin W Layers: Enhancing Reflectivity of W–C Multilayer Coatings*; Mar. 30, 1989.

Nishizawa, J., Abe, H., and Kurabayashi, T.*J . 132(5)* (1985).

Puik, E.J., et al.; *Appln. Surf. Sci. 47* (1991) 251.

Kloidt, A, et al.; *Thin Sol Films, 228* (1993) 154.

Imai, F., Kunimori, K., and Nozoye, H; *Novel Epitaxial Growth Mechanism of Magnesium Oxide/Titanium Oxide Ceramics Superlattice Thin Films Observed by Reflection High–Energy Electron Diffraction*; Nov. 8, 1993.

Kildemo, et al.; *Real Time Control of the Growth of Silicon Alloy Mulitlayers by Multiwavelength Ellipsometry*; 1996.

* cited by examiner

SURFACE PLANARIZATION (Modified CRISP) PROCESS

A) Atomic Layer Deposited Amorphous Si thin film

B) Amorphous Diamond-Like Carbon Deposition

C) Chemical etching of carbon by highly focused oxygen ion beam at near grazing incidence D) Planarized surface with significantly reduced surface roughness

ATOMIC LAYER CONTROLLED OPTICAL FILTER DESIGN FOR NEXT GENERATION DENSE WAVELENGTH DIVISION MULTIPLEXER

This application claims priority to U.S. Provisional Patent Application Ser. No. 60/207,100, entitled ATOMIC LAYER CONTROLLED OPTICAL FILTER DESIGN FOR NEXT GENERATION DENSE WAVELENGTH DIVISION MULTIPLEXER, filed on May 25, 2000, U.S. Provisional Patent Application Ser. No. 60/206,934, entitled OPTICAL FILTER CONSTRUCTION BY ATOMIC LAYER CONTROL FOR NEXT GENERATION DENSE WAVELENGTH DIVISION MULTIPLEXER, filed on May 25, 2000, and U.S. Provisional Patent Application Ser. No. 60/207,101, entitled CHEMICAL-ORGANIC PLANARIZATION PROCESS FOR ATOMICALLY SMOOTH INTERFACES, filed on May 25, 2000.

I. BACKGROUND OF THE INVENTION

A. Field of the Invention

The present invention relates to an oxygen ion process called Chemical Reactive-Ion Surface Planarization (CRISP) which reduces the surface roughness of thin film surfaces at the atomic level.

B. Description of the Related Art

The present invention contemplates a new and improved process for reducing the surface roughness of thin films which is simple in design, effective in use, and overcomes the foregoing difficulties and others while providing better and more advantageous overall results.

There are many commercial applications for thin films and, in particular, multilayer films. One particularly promising application is the use of these films in fiberoptic networks. Multilayered films are used in Dense Wavelength Division Multiplexers/Demultiplexers (DWDM) systems which enable information to be delivered inside the fiber optic cables at multiple wavelengths.

The ability to transmit data via fiber optic cables has become of increasing importance in this technological age. At the present time, the installation of a world-wide fiber-optic network is in progress which will be capable of handling levels of data transmission inconceivable only several years ago. As a result of this network, the Internet is less than half a decade away from being a more useful tool than the computers which navigate it. As the biggest technological revolution in the history of modem civilization progresses, advanced high performance coatings have emerged as the enabling technology. The ability to control transmission and reflection of selected wavelengths of light has enabled existing fiber to accommodate the increase in bandwidth which will be required over the next 3–5 years.

Dense Wavelength Division Multiplexers/Demultiplexer (DWDM) systems enable information to be delivered inside fiber-optic cables at multiples wavelengths. The increase in the bandwidth is limited only by the number of wavelengths which can be superimposed on the fiber. Current state-of-the-art DWDMs can multiplex/demultiplex approximately 130+ channels. Ultimately more than 1000 channels will be possible. During transmission, information is packaged within phase modulated carriers at specific wavelengths and superimposed (multiplexing) on the fiber. During reception, the carriers must be separated (demultiplexing). Optical component technology such as DWDMs are critical to achieve bandwidth necessary for future interactive services such as "video on demand," and have prompted multi-billion dollar strategic acquisitions such as OCLI, NetOptix, and XROS.

The most widely used technology for multiplexing and demultiplexing in DWDM systems is thin film-based. Multilayered thin dielectric coatings are comprised of 150–200 layers with individual optical layer thickness equal to multiples of ¼ of the wavelength to be transmitted (known as dielectric interference filters). A collection of such filters coupled together, each differing slightly in design to allow light transmission of different wavelengths, and "connected" to a fiber-optic cable enables the multiplexing (superposition) and demultiplexing (separation) of multiple wavelengths of laser light containing digital information.

Current thin film multiplexers and demultiplexers can handle up to 40 different wavelengths but several manufacturers have announced 80 channel versions in year 2000. With current state-of-the-art deposition processes used for DWDM, 80 channel multiplexers will approach the limit of the technology. Theoretical thin film filter designs exist with Full Width at Half Maximum (FWHM) of less than 0.1 nm. Such a filter would enable multiplexers capable of handling more than 1000 channels.

Thin film coatings designed to permit light transmission/reflection over narrow (0.1–25 nm) and broad (>25 nm) pass bands are typically comprised of multiple layers of two or more optically matched materials of "high" and "low" indices of refraction. The individual layer thickness and number of layers will ultimately define the optical performance of the filter. Typical narrow band filters (called "high performance") may have more than 100 individual layers.

High performance dielectric thin film optical filters are produced in volume for state-of-the-art multiplexers and demultiplexers used in DWDM systems. These filters are produced with materials such as $SiO_2$ and $Ta_2O_5$ deposited with processes such as ion beam sputter deposition (ISBD) and ion-assisted deposition (IAD). Filters produced with these processes are stable under adverse environmental conditions but lack necessary thickness and roughness control to multiplex/demultiplex more than 80 channels in the desired wavelength range. This is primarily due to excessive roll off of the filter which leads to full width at half maximum (FWHM) of greater than 2 nm (250 GHz).

Surface roughness at interfaces and thickness control are critical factors in determining the performance of a narrow bandpass filter. State-of-the-art filters will incorporate interfacial roughness which increases exponentially with layer number and is ultimately greater than 10% of the layer thickness. Furthermore, in-situ optical and physical thickness monitoring techniques are accurate to within 0.5%. This level of layer control has enabled narrow bandpass filters on the order of 1 nm FWHM (125 GHz).

Surface roughness reduction and interface smoothing by ion bombardment has been examined extensively for multilayered films designed for x-ray reflectors. In that collection of work it was observed that, by ion polishing the film surfaces using $Ar^+$ or $O^+$ ions accelerated from an ion source, average surface roughness ($R_a$) was reduced by a factor of 2. It was also observed that deposition of a thin amorphous carbon (C) layer at each interface, between layers of multilayered reflectors, was successful at reducing interface roughness.

Diamond-like carbon (DLC) produced with plasma-based processes such as ion beam deposition (IBD) and plasma enhanced chemical vapor deposition (PECVD) is a smooth, amorphous and virtually lossless carbon coating. Since the material can be made more than 99% transmissive in the infrared (IR, 800 nm–15 $\mu$m) and has a refractive index of n=2.0, it is commonly used for many IR window applications. Intrinsic stress is compressive and can be quite high, ultimately leading to cracking and delamination in coatings greater than 3.0 μm thick.

It is well known that a very hard low surface roughness amorphous carbon coating can be deposited with various ion processes including ion beam deposition (IBD) and plasma enhanced chemical vapor deposition (PECVD). These coatings are used primarily for anti-abrasion and as antireflective surfaces on germanium substrates for infrared transmissive windows.

Diamond-like carbon (DLC), and other forms of amorphous carbon, can be stripped from substrates by exposing the surface to an energetic (>50V) oxygen plasma. The energetic oxygen ions react chemically with the carbon surface to form carbon monoxide (CO). The vapor pressure of CO is high enough, at the vacuum level at which this process is performed (~$10^{-2}$ torr), that the CO molecules evaporate from the surface. The freshly exposed surface carbon then reacts with the plasma and the process continues until the oxygen plasma is extinguished or no amorphous carbon remains.

II. SUMMARY OF THE INVENTION

An optical filter has been developed which uses, but is not limited to, alternating layers of amorphous Si and diamond-like carbon (DLC) to enable next generation multiplexers and demultiplexers for DWDM systems. The optical filter is unique in that it uses DLC as the "low" index material. It is also unique due to the atomic layer control and sub-angstrom surface roughness achieved as a result of the processing. The design will enable narrow bandpass filters with passbands of 12.5 GHz with the necessary environmental stability to construct next generation optical communications hardware.

In accordance with one aspect of the present invention, a process for optical filter construction includes the steps of growing amorphous silicon layers via self limiting pulsed molecular beam deposition, growing diamond-like carbon layers via an ion-based process, monitoring, during deposition, the layer growth, via interferometric technique capable of sub-angstrom resolution, monitoring intrinsic stress using an in-situ cantilever-based intrinsic stress optical monitor, adjusting the intrinsic stress via deposition parameter modification, depositing the layers onto a substrate, monitoring indices of refraction during deposition via an in-situ ellipsometer, measuring surface roughness using a reflection technique chosen from the group comprising: p-polarized reflection spectroscopy, phase modulated ellipsometry, and real-time atomic force microscopy, directing a focused beam of energetic oxygen ions across the diamond-like carbon at near grazing incidence, and repeating the process as necessary, alternating the silicon and carbon layers.

In accordance with another aspect of the present invention a process for optical filter construction includes the steps of growing a high index layer, growing a diamond-like carbon layer, monitoring layer growth, monitoring intrinsic stress, adjusting intrinsic stress, if necessary, depositing the high index layer onto a substrate, depositing the diamond-like carbon onto the high index layer, monitoring indices of refraction, directing an ion beam onto the carbon layer, and reducing the carbon layer until the carbon layer is approximately atomically smooth.

In accordance with still another aspect of the present invention, the process includes rastering the ion beam in a sweeping fashion to allow interaction with only the carbon that protrudes above average surface height, the rastering being continued until the surface roughness is approximately less than 0.01 nanometers.

In accordance with yet another aspect of the present invention, an optical filter includes a substrate, a high index layer, and a planarized diamond-like carbon layer, the carbon layer having a surface roughness of less than 0.05 nanometers.

In accordance with another aspect of the present invention the filter has alternating multiple layers of the high index layer and the diamond-like carbon layer, the high index layer is silicon, and the surface roughness is approximately less than 0.01 nanometers.

In accordance with still another aspect of the present invention, an atomic layer controlled optical filter system includes a substrate, a high index layer, a diamond-like carbon layer, means for monitoring layer growth, means for monitoring intrinsic stress, means for adjusting intrinsic stress, if necessary, means for depositing the high index layer onto a substrate, means for depositing the diamond-like carbon onto the high index layer, means for monitoring indices of refraction, means for directing an ion beam onto the carbon layer, and means for reducing the carbon layer until the carbon layer is approximately atomically smooth.

Still other benefits and advantages of the invention will become apparent to those skilled in the art upon a reading and understanding of the following detailed specification.

III. BRIEF DESCRIPTION OF THE DRAWINGS

The invention may take physical form in certain parts and arrangement of parts. At least one embodiment of these parts will be described in detail in the specification and illustrated in the accompanying drawings, which form a part of this disclosure and wherein.

IV. DESCRIPTION OF THE INVENTION

Figure 1:
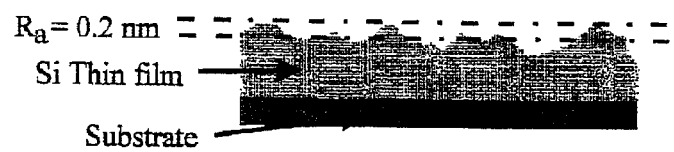
FIG. 1A shows an atomic layer deposited amorphous silicon thin film.
FIG. 1B shows an amorphous diamond-like carbon deposition.
FIG. 1C shows chemical etching of carbon by highly focused oxygen ion beam at near grazing incidence; and, FIG. 1D shows a planarized surface with significantly reduced surface roughness.
Figure 1:
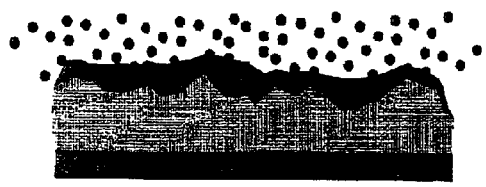
Figure 1:
Figure 1:
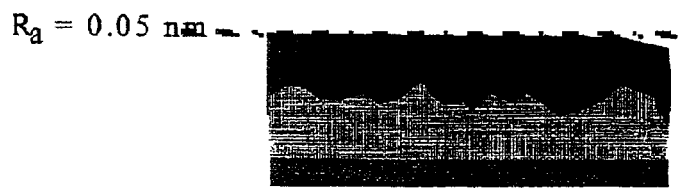

Referring now to the drawings, which are for purposes of illustrating at least one embodiment of the invention only, and not for purposes of limiting the invention, FIGS. 1A–1D show an optical filter that uses alternating layers of amorphous silicon (Si) and diamond-like carbon (DLC). In this case, DLC is referred to as the "low" index material and the Si as the "high" index material. It is to be understood that any high index material could be used, as long as chosen using sound engineering judgment. It is also to be understood that any amorphous carbon may used, as long as it exhibits substantially similar characteristics as DLC, and is chosen using sound engineering judgment.

The Si layers are grown with a self-limiting pulsed molecular beam deposition process, or any other similar process chosen using sound engineering judgment, which results in layer-by-layer growth. The Si layer thickness is monitored during deposition using an interferometric technique, or any other similar technique chosen using sound engineering judgment, which is capable of sub-angstrom resolution. This process enables thickness control to within one atomic layer.

The DLC layers are produced using an ion-based process and monitored during deposition using a similar interferometric technique. The DLC surface can be made atomically smooth using a modified Chemical Reactive-Ion Surface Planarization (CRISP) process. In this case, at the conclusion of the DLC layer the surface roughness is measured in-situ using a reflection technique such as p-polarized reflection spectroscopy (PRS), phase modulated ellipsometry (PME), or real time atomic force microscopy (AFM).

After the surface roughness has been accurately determined, a highly focused beam of energetic oxygen ions is swept across the DLC surface as shown in FIG. 1C. An additional layer of amorphous carbon is not necessary since DLC is used as one of the filter materials. The modified CRISP process is performed until the surface roughness is reduced to less than 0.01 nm.

Alternating layers of Si and DLC are produced and prepared in the above fashion until the filter is complete. Intrinsic stress is monitored using an in-situ cantilever-based intrinsic stress optical monitor and adjusted during filter fabrication by deposition parameter modification. This is necessary since the intrinsic stress, if controlled, may eventually cause the film to crack or delaminate from the substrate. Since modification of the deposition parameters may affect the index of refraction of the individual layers, an in-situ ellipsometer is used to monitor the indices of refraction during deposition. If the index of any given layer is changed due to a change in deposition parameters, the filter design is adjusted mid-deposition to accommodate the change. This is possible due to the sub-angstrom thickness control of the individual layers.

The resulting filter has sufficient individual layer thickness control and surface roughness to enable ~12.5 GHz filters for next generation multiplexers and demultiplexers with more than 1000 channels in the wavelength range 1.31–1.62 $\mu$m.

The invention has been described with reference to at least one embodiment. Obviously, modifications and alterations will occur to others upon a reading and understanding of the specification. It is intended by applicant to include all such modifications and alterations insofar as they come within the scope of the appended claims or the equivalents thereof.

We claim:

1. An optical filter comprising:
   a substrate;
   a high index layer; and,
   a planarized diamond-like carbon layer, the carbon layer having a surface roughness of less than 0.05 nanometers.

2. The filter of claim 1, wherein the filter has alternating multiple layers of the high index layer and the diamond-like carbon layer.

3. The filter of claim 2, wherein the high index layer is silicon.

4. The filter of claim 3, wherein the surface roughness is approximately less than 0.01 nanometers.

5. An atomic layer controlled optical filter system, the system comprising:
   a substrate;
   a high index layer;
   a diamond-like carbon layer;
   means for monitoring layer growth;
   means for monitoring intrinsic stress;
   means for adjusting intrinsic stress, if necessary;
   means for depositing the high index layer onto a substrate;
   means for depositing the diamond-like carbon onto the high index layer;
   means for monitoring indices of refraction;
   means for directing an ion beam onto the carbon layer; and,
   means for reducing the carbon layer until the carbon layer has a surface roughness of less than 0.05 nanometers.

6. A optical filter comprising alternating layers of a high index of refraction material and diamond-like carbon wherein each diamond-like carbon layer has a surface with a surface roughness of less than 0.05 nm.

7. The optical filter of claim 6 forming a narrow bandpass filter having a passband of about 12.5 GHz.

8. The optical filter of claim 7 wherein the layers of high index of refraction material comprise amorphous silicon.

9. The optical filter of claim 6 wherein the layers of high index of refraction material comprise amorphous silicon.

* * * * *